United States Patent
Ishizaki et al.

(10) Patent No.: US 7,872,524 B2
(45) Date of Patent: Jan. 18, 2011

(54) AMPLIFICATION CIRCUIT, AMPLIFICATION CIRCUIT NOISE REDUCING METHOD AND PROGRAM THEREOF

(75) Inventors: Haruya Ishizaki, Tokyo (JP); Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 38 days.

(21) Appl. No.: 12/439,971

(22) PCT Filed: Sep. 13, 2007

(86) PCT No.: PCT/JP2007/067792

§ 371 (c)(1),
(2), (4) Date: Mar. 4, 2009

(87) PCT Pub. No.: WO2008/032763

PCT Pub. Date: Mar. 20, 2008

(65) Prior Publication Data

US 2010/0045372 A1 Feb. 25, 2010

(30) Foreign Application Priority Data

Sep. 14, 2006 (JP) ............................. 2006-250122

(51) Int. Cl.
*H03F 1/36* (2006.01)
(52) U.S. Cl. ...................... 330/107; 330/109
(58) Field of Classification Search ............. 330/9, 330/107, 109
See application file for complete search history.

(56) References Cited

U.S. PATENT DOCUMENTS 7,227,408 B2 * 6/2007 Candy ........................ 330/10

FOREIGN PATENT DOCUMENTS

| JP | 1989284106 A | 11/1989 |
| JP | 286612 A | 12/1991 |
| JP | 1995288485 A | 10/1995 |
| JP | 2000114880 A | 4/2000 |
| JP | 2001119365 A | 4/2001 |

OTHER PUBLICATIONS

International Search Report for PCT/JP2007/067792 mailed Dec. 18, 2007.
Jing-Hong Conan Zhan, et al. "A 5GHz Resistive-Feedback CMOS LNA for Low-Cost Multi-Standard Applications", Proceedings of 2006 IEEE International Solid-State Circuits Conference, Session 11, Feb. 7, 2006.

* cited by examiner

*Primary Examiner*—Steven J Mottola

(57) ABSTRACT

[Problems] to provide a CMOS low-noise amplification circuit which can reduce a chip area and design time, and which is easy to be digital-controlled from outside. [Means For Solving the Problems] The amplification circuit includes; an amplification stage (12) which amplifies an input signal up to an intended value; a sample and hold circuit (13) which samples the output signal from the amplification stage (12) by sampling the output signal with a sampling frequency which is at least twice the frequency band of the output signal to convert the output signal to a discrete time signal; a moving average calculation unit (15) which selects and outputs a particular frequency from the discrete time signal outputted from the sample and hold circuit (13) by a moving average operation; and a smoothing filter (17) which smoothes the output signal from the moving average calculation unit (15) and feed it back to the input of the amplification stage (12).

11 Claims, 9 Drawing Sheets

FREQUENCY CHARACTERISTIC OF MOVING
AVERAGE CALCULATION UNIT

IMPLEMENTATION EXAMPLE OF ATTENUATION
CIRCUIT BY SOURCE FOLLOWER

IMPLEMENTATION EXAMPLE OF ATTENUATION
CIRCUIT BY RESISTANCE VOLTAGE DIVIDER

CONTROL OF FREQUENCY CHARACTERISTIC BY
DISCRETE FEEDBACK

AMPLIFICATION CIRCUIT, AMPLIFICATION CIRCUIT NOISE REDUCING METHOD AND PROGRAM THEREOF

The present application is the National Phase of PCT/JP2007/067792, filed Sep. 13, 2007, which claims priority based on Japanese Patent Application No. 2006-250122 filed on Sep. 14, 2006, the entire disclosure of which is incorporated herein.

BACKGROUND OF THE INVENTION

1. Field of the Invention

The present invention relates to an amplification circuit, an amplification circuit noise reducing method and a program therefor, and particular, to a low-noise amplification circuit for radio communication front end created by using a digital CMOS device, a noise reducing method and a program for this amplification circuit.

2. Related Art

In accordance with the improvements in the mutual conductance and current gain cut off frequency due to the miniaturization developed in the CMOS manufacturing technology, the operational band and the noise characteristic of the CMOS circuit have been improved. As the result, a radio communication front end circuit, which had been traditionally manufactured with a compound semiconductor such as gallium arsenide or silicon-germanium, or a silicon bipolar device, can be manufactured by using a CMOS circuit. Particularly, a low-noise amplifier, which is an important block on determining the gain and noise characteristic of the entire radio receiving circuit, becomes possible to be manufactured on the same CMOS chip as a baseband logic. An example of a CMOS low-noise amplifier manufactured on the same chip as the baseband logic will be shown in FIG. 1.

In FIG. 8, an antenna 100, and a radio frequency band selecting filter and a transmission/reception switching device 101 are formed as off-chip elements 102, and subsequent elements from a low-noise amplifier are formed as on-chip elements.

A radio communication signal received by the antenna 100 is very weak, and at around the minimum reception sensitivity depending on the recent communication standard applied to the communication in which a digital modulation has been adopted, the amplitude of the signal is about several microvolts to several tens of microvolts.

The received signal power to the noise ratio has been improved in accordance with the improvement of the band use efficiency due to the development of the digital modulation technologies. However, the reflectance loss generated due to the impedance mismatch at an input unit of a receiving circuit has to be eliminated. Accordingly, when designing the CMOS low-noise amplifier, it is required to generate a high gain while preventing a heat noise from being generated at a circuit, with input being matched at on-chip.

In FIG. 8, an input matching unit 106 (a first order filter) is configured with such as an inductor A103, an inductor B104, and a capacitance C1 between a gate and a source of a transistor 105, to realize the matching with an output impedance of the off-chip side. And, by including an inductor C107 further, it is intended to enhance the gain and provide the frequency characteristic. However, when each of the inductors 103, 104, and 107 is fabricated on a silicon chip, it is formed in many cases with a spiral inductor whose low resistor wiring at the upmost layer is in a spiral shape. Here, a transistor 108 serves as an output switching.

Since an area of the spiral inductor is determined depending on an intended bandwidth (carrier wave frequency to be transmitted in an aerial, in the case of the low-noise amplifier) and is not reduced in accordance with the miniaturization of the CMOS device, the low-noise amplifier using many inductors becomes disincentive when the area of the chip is intended to be reduced for the radio communication circuit.

There is such a possibility that even the reduction in the chip cost due to the process for miniaturization cannot pay off the drastically increasing cost of the mask, which has become a problem, used in the miniaturization process, as a result of being restricted due to the inductor area.

When an alternate current frequency is $\omega$, an impedance ZL generated particularly in an inductor L is expressed as $ZL=j\omega L$. For this reason, the inductance value L is required to be larger as the alternate current frequency $\omega$ (in the case of the low-noise amplifier, carrier wave frequency) is lower. As the result, the layout area of the inductor on the chip becomes greater as the frequency is in a lower band, and the reduction in the chip cost is suppressed more. Further, a wiring parasite resistance becomes greater, which has undesirable effects on the high frequency characteristic, such as deterioration in the noise characteristic and decrease in the gain.

Also, those inductors require a tuning step which is specific for an analog circuit typified by L and C combination, accompanied with repetition of a plurality of re-design and trial productions. In this regard, the development time and steps are required.

There is also an approach to realize high gain and frequency characteristic required for the low-noise amplifier by adding a negative feedback loop with the CMOS circuit, instead of tuning by the spiral inductor described above.

A configuration. shown in FIG. 9 is described in Non-Patent Document 1. In this example, the negative feedback is formed in such a manner that an amplification stage output from the CMOS low-noise amplifier configured with a transistor A201 and a transistor B202 is returned to an amplifier input h via a resistance R2 and a capacitance C2. This example shows that the frequency characteristic and the gain are changed according to the value of the resistance R2 at this time.

However, since the circuit configuring the feedback loop is an analog circuit and partly a passive element, there is such a problem that controlling the characteristic by an external signal is difficult. Further, though it is possible to reduce the chip area since this example doesn't use the spiral inductor or the like and it follows a process scaling of a digital CMOS device, an element, such as analog tuning between the transistor and the resistance R2, and between the transistor and the capacitance C2, still remains. Accordingly, problems such that the repetition of a plurality of re-design and trial productions is required, and a reconstruction of the characteristic after design is difficult, also inevitably remain.

In FIG. 9, if a circuit element which can be digitally-controlled easily, such as a filter for example, is added in the loop, it becomes possible to digitally-control the high frequency characteristic of the low-noise amplifier, which had been difficult to realize with the traditional art. According to this idea, however, a feedback configuration for variously changing the characteristic from the outside is to be added, and it carries a risk of oscillation. For this reason, a technique to suppress the risk of oscillation is required at the same time. As an example, by forcibly attenuating a signal to be fed back in particular so that the loop gain becomes to be equal to or less than one, the risk of oscillation due to the intensification of the input signal and the signal to be fed back can be suppressed.

As a digital type amplifier, as shown in Patent Document 1, a method with which, by splitting a signal wave having an envelope variation into two-types of the constant envelope modulated waves, amplifying and combining respective constant envelope modulated waves, an output amplitude of a signal wave having an envelope variation is amplified with relatively low-noise and low-deformation while maintaining the linearity, is reported.

Patent Document 1: Japanese Patent Application Laid-Open No. 01-284106

Non-Patent Document 1: Proceedings of 2006 IEEE International Solid-State Circuits Conference, description page, Section 200 and 201, 11.5

DISCLOSURE OF THE INVENTION

Problems to be Solved by the Invention

The CMOS low-noise amplification circuit described above has following problems.

One problem is as follows: the CMOS low-noise amplification circuit requires, in addition to a CMOS transistor, passive elements such as a resistance, a capacitance, and inductors, and the high-frequency characteristics such as the gain and the frequency characteristic depends on the manufacturing precision of those passive elements. However, there is such a problem that a manufacturing process of those passive elements with high precision is accompanied with repetition of re-design and trial productions in general, and it takes time, steps, and cost. In particular, even when the miniaturization process is used to improve the band and noise characteristics, an area of an inductor is not subject to the scaling, and the reduction in the chip cost is prevented. As a result, there is a possibility that the price of the mask is not paid off.

Another problem is as follows: the signal processing in the low-noise amplifier is processed in a continuous-time domain, and also the filter and the other circuits are analog circuits. With these continuous-time processing and analog circuits, controlling the RF characteristics such as the frequency band and the gain from outside is difficult compared to a case of using digital circuits, and also reconfiguring after the design is difficult.

An exemplary object of the present invention is to provide a CMOS low-noise amplification circuit which can solve the above described problems to reduce the chip area and shorten the work period for design, and which is easy to be digitally-controlled from outside, a noise reducing method used by the amplification circuit and a noise reducing program therefor.

Means for Solving the Problems

To solve the above described problems, an amplification circuit of the invention is a circuit which amplifies and outputs an input signal, including; an amplification device which amplifies the input signal up to an intended value; a discretizing device which converts the output signal of the amplification device to a discrete time signal by sampling the output signal with a sampling frequency which is at least twice the frequency band of the output signal; a discrete time filter which selects a specific frequency band from the discrete time signal outputted from the discretizing device and outputs a signal of the specific frequency band; and a continuous device which smoothes an output signal of the discrete time filter to be a continuous time signal and feeds back the continuous time signal to input of the amplification device.

With this, it becomes possible to realize a low-noise amplification circuit having a small area, which can select the bands desired to be eliminated by using the discrete time filter and control the frequency characteristics by negatively feeding back the signal of the bands to input, without using a passive element such as an inductor in a CMOS device.

To solve the above described problems, an amplification circuit noise reducing method of the present invention is the noise reducing method for an amplification device which amplifies an input signal, including; a discretization step of converting the output of an amplification device to a discrete time signal by sampling the output; a signal processing step of performing a discrete time filter processing to the discrete time signal obtained in the discretization step by calculation; a continuous step of smoothing a signal which is discrete time filter processed in the digital signal processing step to be a continuous signal; a negative feedback step of adding the continuous signal formed to be continuous in the continuous step, with the phase being reversed, to the input signal of the amplification device; and an amplification step of amplifying the input signal and the continuous signal whose phase is reversed, which are added in a negative feedback step by the amplification device.

With this, by filtering a signal in a certain frequency band through a digital processing, and negatively feeding back the signal, the amplification circuit noise reducing method with which the noise reduction can be performed by the digital processing is realized.

To solve the above described problems, an amplification circuit noise reducing program of the present invention is the noise reducing program for an amplification device which amplifies an input signal, causing a computer to execute; a digital signal processing function of performing a discrete time filter processing, by a digital calculation, to the discrete time signal obtained in the sampling processing; a continuous function of smoothing a signal which is discrete time filter processed by the digital signal processing function to be a continuous signal; and a negative feedback function of adding the continuous signal formed to be continuous by the continuous function to the input signal of the amplification device with the phase of the continuous signal being reversed.

With this, by filtering a signal in a certain frequency band through a computer processing and negatively feeding back the signal, the program which causes the computer to execute the noise reduction in an amplification function by the digital processing is realized.

EFFECTS OF THE INVENTION

As described above, with the present invention, the low-noise amplification circuit is realized by using a discretization processing for a signal. Therefore, the low-noise amplification circuit can be realized by using the digital technique, not using a passive element. By using this amplification circuit for a front end of a digital radio receiving device, it becomes possible to reduce the chip area of the receiving device drastically, and further, since an analog tuning step is not required in a manufacturing process, a work period for design can be shortened. Also, a noise reducing method used for the amplification circuit can be provided.

BEST MODE FOR CARRYING OUT THE INVENTION

In the followings, embodiments of the present invention will be described in detail with reference to the accompanying drawings. It is to be understood that the invention is not limited to the embodiments.

First Exemplary Embodiment

FIG. 1 shows a block diagram of a digital low-noise amplification circuit according to a first exemplary embodiment of the invention.

The digital low-noise amplification circuit includes; an amplification stage (A) 11 which amplifies a high frequency signal from an antenna not shown, an adder 18 which adds an output of the amplification stage (A) 11 and a feedback signal; an amplification stage (B) 12 which further amplifies the output of the adder 18; a sample and hold circuit 13 which samples an output of the amplification stage (B) 12 and holds it for forming a discrete time signal; a moving average calculation unit 15 which performs a moving average operation to the discrete time signal; an attenuation circuit 16 which attenuates a signal calculated by the moving average calculation unit 15 at a constant rate; a smoothing filter 17 which smoothes a waveform of the discrete time signal outputted from the attenuation circuit 16 by eliminating harmonic component and inputs the signal to the adder 18; and a clock generator 14 which provides a clock to the sample and hold circuit 13 and the moving average calculation unit 15.

The amplification stage (A) 11 amplifies a high frequency signal (amplifier input) outputted from the antenna filter while keeping an impedance matching and suppressing a heat noise to be generated at the circuit.

The adder 18 adds the high frequency signal outputted from the amplification stage (A) 11 and a signal outputted from the smoothing filter 17, with the phase being reversed.

The amplification stage (B) 12 further amplifies the high frequency signal outputted from the adder 18 up to a signal level required as an output of the entire low-noise amplifier.

Here, the amplification stages may be configured such that the amplification stage (A) 11 is an impedance matching circuit with no amplification function and the amplification stage (B) 12 has all of the amplification functions.

The clock generator 14 provides a sampling clock to the sample and hold circuit 13 and the moving average calculation unit 15 (a clock generating device).

The sample and hold circuit 13 receives the sampling clock provided from the clock generator 14 through a sampling clock distributing system, samples a signal outputted from the amplification stage (B) 12, and holds it a prescribed time to form a discrete time signal (a discretizing device).

The moving average calculation unit 15 creates a moving average yi expressed by an expression 1, from among the signals which are converted to the discrete time signals (xi, xi+1, xi+2k . . . ) by the sample and hold circuit 13 and outputted, and a discrete time filter is configured thereby.

[EXPRESSION 1]

$$yi=(1/L)*\{aixi+a(i+1)\times(i+1)+\ldots a(i+L-1)\times(i+L-1)\} \quad (1)$$

Here, in the expression 1, L is a filter length determined by the frequency characteristic required in the low-noise amplification circuit.

The attenuation circuit 16 attenuates the signal calculated and outputted by the moving average calculation unit 15 at a constant rate.

The smoothing filter 17 is an analog filter which smoothes a waveform of the discrete time signal outputted from the attenuation circuit 16 by eliminating the harmonic component and restores to a continuous signal, and serves as a continuous device for the discrete time signal. A continuous time signal outputted from the smoothing filter 17 is added to a signal outputted from the amplification stage (A) 11 by the adder 18, and returned to the input of the amplification stage (B) 12. At this time, the phases of the signal outputted from the amplification stage (A) 11 and the signal outputted from the smoothing filter 17 are reversed with each other, and they are in a relation to be canceled each other by addition at the adder 18.

Note that the sample and hold circuit 13, which repeats on/off operations according to the sampling clock, includes a sampling switch which samples a signal outputted from the amplification stage (B) 12 at every prescribed time and a sampling capacity unit which accumulates signals outputted from the sampling switch and holds the signals for a prescribed period.

Next, an operation of the low-noise amplifier of the exemplary embodiment will be described in detail.

A receiving signal "a" which is converted to a weak electric signal through an antenna filter is inputted into the amplification stage (A) 11, and next, the amplification stage (B) 12. Here, a spiral inductor and the like used in a common low-noise amplification circuit for obtaining high gain are not able to be used from such a principle of this proposal that the usage of the passive element is avoided as much as possible. In order to suppress a reflection loss, an impedance matching is required to be established in between the antenna filter output and the amplification stage (A) 11 at the very least. However, to suppress the heat generation as much as possible, matching by using a resistance component is avoided in an ordinal low-noise amplifier. Therefore, an input impedance is defined by using L component and C component generated parasitically with the input/output of the chip, a capacitance between a source and a drain of an input device (in a case of NMOS), and a mutual conductance of the device, so as to establish the matching. As the result, though the input matching has a frequency characteristic as that of L and C filters, a large inductance component such as the spiral inductor as described above is not to be used, and the frequency characteristic possessed only by the amplification stage (A) 11 and the amplification stage (B) 12 is gentle.

The signal outputted from the amplification stage (B) 12 is inputted to the sample and hold circuit 13. A sampling switch 131, configured with a MOSFET which is driven by the sampling clock of the frequency fs provided from the clock generator 14 and repeats on/off operations, is located at a first stage of the sample and hold circuit 13. The sampling switch 131 of the sample and hold circuit 13 samples the voltage amplitude value of the input signal at every one cycle 1/fs of the sampling clock, sends the value to the sampling capacity unit 132 of the latter stage and makes the sampling capacity unit 132 to hold the value.

Since the operation of the MOSFET used in the sample and hold circuit 13 is a simple on and off operation, a special tuning process such as a high precise matching of the device sizes performed in the traditional analog circuit design is not required. The sampling capacity unit 132 holds the sampled input signal value for a prescribed time. This holding time takes such a value to be changed according to duty ratio of the sampling clock, the circuit structure of the sample and hold circuit 13, and the like.

Here, this sampling clock frequency fs is required to be twice or more times the signal band according to a sampling theorem. However, the signal band used in an ordinal radio communication is tens of MHz at most (22 MHz in a case of IEEE802.11b of the radio LAN standard), except for a broadband radio communication occupying bands more than hundreds of MHz such as UWB (ultra wide band) or millimeter wave communication. Therefore, minimum frequency fs to be required is one-tenth or less of a carrier wave frequency of GHz order, and it is inconceivable that the operation band is restricted when the sample and hold circuit 13 is added to the traditional structure.

In this way, at the sample and hold circuit 13, the input signal is converted from the continuous time signal to the discrete time signal, and outputted to the moving average calculation unit 15. Consequently, the data processing and the circuit operation such as a filtering, based on the digital signal processing, become possible for the sample and hold circuit 13 and the subsequent elements.

The discrete time signal outputted from the sample and hold circuit 13 is provided to the moving average calculation unit 15 of the next stage. A moving average calculation of EXPRESSION 1 performed there is a kind of digital filters dealing with the discrete time signal, which is a finite impulse response filter with no feedback.

For simplicity, in the moving average calculation expressed by EXPRESSION 1, weights of respective terms to be added are assumed as being equal. That is, ai=ai+1= . . . ai+L−1=1.

The frequency characteristics of the moving average calculation unit 15 for respective cases of L=2 and L=3 with respect to the gain (a) and the delay amount (b) are shown in FIG. 2. In FIG. 2, a solid line part indicated as "2-TAP" shows a characteristic in a case of L=2 in EXPRESSION 1, and a dashed line part indicated as "3-TAP" shows a characteristic in a case of L=3 in EXPRESSION 1. From FIG. 2, it is found that the moving average calculation (EXPRESSION 1) expresses a low-pass filter which cuts a harmonic component, and a zero point (a frequency area where the gain becomes zero) which is a feature of the finite impulse response type filter is generated.

The discrete time signal outputted from the moving average calculation unit 15 is sent to the attenuation circuit 16. As an example of a specific circuit to perform such attenuation, an analog buffer such as a source follower formed by an NMOS transistor 51 and a PMOS transistor 52, which can attenuate a signal, is cited as shown in FIG. 3A, and such a circuit is required to have a frequency band with which the signal band is not damaged. Also, this portion can be simply realized with a resistance voltage divider as shown in FIG. 3B. However, when it is realized with the resistance voltage divider, since direct current flows from a power source to the ground constantly, values of a resistance A53 and a resistance B54 are required to be set large, respectively, from the standpoint of reducing the power consumption of the circuit.

The discrete time signal outputted from the attenuation circuit 16 is sent to the smoothing filter 17. This smoothing filter 17 is an analog low-pass filter which smoothes the discrete time signal by eliminating the harmonic component to convert the signal to the continuous time signal, and eliminates a folded component included in the discrete time signal, and the filter can be configured with a resistance and a capacitance at the very least.

If the folded component is eliminated and a smoothed continuous time signal is formed, a signal from which a high frequency of the output of the moving average calculation unit 15 is cut can be obtained. The output signal from the smoothing filter 17 is added to the output from the amplification stage (A) 11 by the adder 18, and inputted to the amplification stage (B) 12.

At this time, there is such a necessary condition that a phase of the output signal of the smoothing filter 17 is reversed with respect to the phase of the output from the amplification stage (A) 11 by a filter group delay, which is expressed by EXPRESSION 1, obtained with the moving average calculation unit 15, the attenuation circuit 16, and the smoothing filter 17. A negative feedback is established as long as this condition is satisfied, and an original intention such as controlling the frequency characteristic by cutting the low frequency can be obtained. On the other hand, when the condition is not satisfied and both phases of the signals intended to be reversed are being the same phase, a positive feedback is established and signals intensify each other, thus there is a possibility of occurrence of an oscillation in the frequency band.

A result from a simulation in which the frequency characteristic of the amplification circuit is controlled by a series of operations, from the input to the amplification stage (B) 12, via the operations of the sample and hold circuit 13, the moving average calculation unit 15, the attenuation circuit 16, the smoothing filter 17, and the adder 18, to the negative feedback to the amplification stage (B) 12, as described above, is shown in FIG. 4.

This shows a transmission function from the input to the amplification stage (B) 12 to the amplifier output b.

The conditions used in the simulation are described in the following.

The gain of the amplification stage (B) 12 is 3 dB, and there is no frequency characteristic, being flat.

The frequency of the sampling clock inputted to the sample and hold circuit 13 is 2.0 GHz, which becomes a sampling frequency at the time of the signal discretization.

The moving average calculation unit 15 is provided with considering two cases, a case of L=2 in EXPRESSION 1, and a case of L=3 in EXPRESSION 1. The frequency characteristic is as shown in FIG. 2.

The attenuation circuit 16 attenuates the signal to 0.7 times the original signal.

The smoothing filter 17 is a passive filter configured with a resistance of 1000Ω and a capacitance of 250 fF.

From FIG. 4, it is found that the peak point of the gain of the amplifier is shifted by only changing a filter length L of the moving average calculation unit. The choice between the case of L=2 and the case of L=3 can be easily changed according to a digital control signal on the circuit, such as a frequency fs of the sampling clock generated by the clock generator 14.

When the sampling frequency fs is set to be larger, the folding component is positioned at farther point from an intended frequency component, and an order of the smoothing filter can be at lower.

In fact, the order of the smoothing filter used in the simulation shown in FIG. 4 is first order, and the required capacity value can be realized with a small layout area. It is a portion not especially requiring a tuning and the object is achieved when the folding can be eliminated, so it is considered that an analog element does not increase from the traditional art by adding this filter.

Here, since the amplification stage (B) 12 to which a feedback loop is added feeds back the signal to which a heat noise is added at the circuit and input the signal again, a noise characteristic becomes worsen. Therefore it is required to suppress the circuit generated heat noise as much as possible for the signal amplification performed in the amplification stage (A) 11.

For example, a system in which a stage 1 having a noise figure NF1 and a gain Ga1 and a stage 2 having a noise figure NF2 and a gain Ga2 are connected in series is considered. It is assumed that an output impedance of the stage 1 and an input impedance of the stage 2 are matched completely, and there isn't a loss due to a reflection and the like.

In this case, a synthesized noise figure NFtotal considering from the stage 1 input to the stage 2 output is calculated as follows.

[EXPRESSION 2]

$$Nftotal32\ NF1+(NF2-1)/Ga1 \quad (2)$$

According to this, when the noise figure of the amplification stage (A) 11 is 1.5 dB and the gain is 20 dB, and also the noise figure of the amplification stage (B) 12 is 10 dB, the synthesized noise figure in the exemplary embodiment becomes 1.8 dB.

Also, when the heat noise generated in the amplification stage 1 increases and the noise figure becomes to be 2.5 dB, the synthesized noise figure becomes to be 2.7 dB.

Since the degraded amount of the noise figure at the first stage becomes a degradation of the receiving sensitivity as it is in the radio receiving system, it is important to suppress the heat noise generation at the amplification stage 1 for implementing this invention. Assuming that an average voltage amplitude of the circuit generated heat noise for a unit frequency is Vn, Boltzmann constant is k, temperature is T, and resistance component of the circuit is R, the average voltage amplitude of the circuit generated heat noise, Vn, is expressed as EXPRESSION 3.

[EXPRESSION 3]

$$Vn=4kTR \quad (3)$$

Since an inverse of the mutual conductance of the transistor which performs amplification corresponds to R of EXPRESSION 3 at the amplification circuit, when the transistor size of the amplification stage (A) 11 is taken large, the heat noise generation can be suppressed. However, it also means an increase in power consumption in this case, therefore the optimization of the circuit configuration is required to be performed while considering the trade-off relation between the desired noise characteristic and the power consumption.

Second Exemplary Embodiment

FIG. 5 shows a block diagram of a digital low-noise amplification circuit according to a second exemplary embodiment of the invention.

The digital low-noise amplification circuit includes: an amplification stage (C) 21 which amplifies a high frequency input signal c, an adder 28 which adds an output of the amplification stage (C) 21 and a feedback signal from a digital-to-analog converter 27; an amplification stage (D) 22 which further amplifies the output of the adder 28 and outputs an output signal d; a sample and hold circuit 23 which samples and holds an output of the amplification stage (D) 22; an analog-to-digital converter 25 which A/D converts the discrete time signal; a digital signal processor 26 which calculates to process the digitally-converted signal; the digital-to-analog converter 27 which D/A converts the output of the digital signal processor 26; and a clock generator 24 which provides a clock to the sample and hold circuit 23 and the analog-to-digital converter 25.

The second exemplary embodiment is different from the first exemplary embodiment in that the discrete time signal outputted from the sample and hold circuit 23 is inputted into the analog-to-digital converter 25 to be converted to a digital signal, inputted to the digital signal processor 26 to be filtered, then inputted to the digital-to-analog converter 27 to be restored to an analog signal, and supplied to the amplification stage (D) 22 as a negative feedback.

Next, operations of the second exemplary embodiment will be described. Here, only the operations different from those of the first exemplary embodiment will be described mainly.

The discrete time signal outputted from the sample and hold circuit 23 is supplied to the analog-to-digital converter 25 of a next stage. The analog-to-digital converter 25 quantizes the input signal being an analog signal and convert it to a digital signal corresponding to a signal voltage amplitude, and the signal is outputted to the digital signal processor 26. That is, the sample and hold circuit 23 and the analog-to-digital converter 25 function as a digital discretization device.

The digital signal outputted from the analog-to-digital converter 25 is supplied to the digital signal processor 26. There, after a series of filtering processes such as low-pass, band-pass, and phase rotation, and attenuation process, the input signal is outputted to the digital-to-analog converter 27.

The digital signal outputted from the digital signal processor 26 is converted to a continuous analog signal by the digital-to-analog converter 27, and added, by satisfying a condition to be a negative feedback, to the input of the amplification stage 2. Operations following the negative feedback to the amplification stage 2 are the same as those of the first exemplary embodiment. The digital-to-analog converter 27 functions as a continuous device which converts the digital signal outputted from the digital signal processor 26 to the continuous time signal.

Functions such as discrete signal filtering and attenuation, realized in the first exemplary embodiment by circuits, are realized by the digital signal processor 26 in the second exemplary embodiment. Therefore, a more complicated processing compared to the processing of the first exemplary embodiment, such as providing a band-pass filter characteristic, is possible in the filtering process, and it is easy to control the characteristic digitally.

However, the number of digital circuits which operate at a high speed increases compared to the case of the first exemplary embodiment, and also the circuit scale is enlarged. As the result, compared to the case of the first exemplary embodiment, the second exemplary embodiment is advantageous in terms of controllability, but also is disadvantageous in terms of cost, with respect to the power consumption and chip area.

Third Exemplary Embodiment

FIG. 6 shows a block diagram of a digital low-noise amplification circuit according to a third exemplary embodiment of the invention.

The third exemplary embodiment includes: an amplification stage (E) 31 which amplifies a high frequency signal e, an adder 38 which adds an output of the amplification stage (E) 31 and a feedback signal; an amplification stage (F) 32 which further amplifies the output of the adder 38 and outputs an output signal f; a sample and hold circuit 33 which samples an output of the amplification stage (F) 32 and holds it to form a discrete time signal; a discrete time filter 35 which performs a filtering process to the discrete time signal; an attenuation circuit 36 which attenuates a signal calculated by the discrete time filter 35 at a constant rate; a smoothing filter 37 which smoothes a waveform of the discrete time signal outputted from the attenuation circuit 36 by eliminating harmonic component and inputs the signal to the adder 38; a clock generator 34 which provides a clock to the sample and hold circuit 33 and the discrete time filter 35; and a stop signal providing device 39 which stops the output of the clock generator 34.

In the third exemplary embodiment, the sampling clock provided from the clock generator 34 to the sample and hold circuit 33 and the discrete time filter 35 is stopped appropriately by a stop signal provided from the stop signal providing device 39. With this, operations of the sample and hold circuit 33 and the discrete time filter 35 are stopped, so as to reduce the power consumption of those parts.

Accordingly, the third exemplary embodiment is different from the first and second exemplary embodiments in that the stop signal providing device 39 is added.

Next, operations of the third exemplary embodiment will be described. Here, only the operations different from those of the first and second exemplary embodiments are described.

When a digital radio communication takes the form of a packet communication or the like, there are a time for transmitting/receiving a signal and activating a circuit, and a time for not doing so. Particularly in the latter time, since the communication is not performed, it is desirable that unnecessary circuit operations be suppressed in the view of power saving. For this reason, the stop signal providing device 39 which is programmed to provide a signal for stopping a circuit when the communication is not performed is added, and the sample and hold circuit 33 and the discrete time filter 35 are stopped by the stop signal provided therefrom.

With this, unnecessary circuit operations at the time of not communicating can be suppressed easily by a digital control. In this regard, however, since the configuration of the third exemplary embodiment includes a feedback loop, if the circuit is switched from a stopped state to an activated state by the signal, a certain lockup time is needed for the frequency characteristics such as a gain to be settled to an intended value. Consequently, the circuit activating time has to be determined by adding the lockup time to the time actually desired for the signal processing following the amplifier output "f", for outputting the stop signal from the stop signal providing device 39. This lockup time is a value determined uniquely by a circuit parameter.

Further, if the low-noise amplifier using the discretization processing shown in the present invention is incorporated in a radio receiver, the circuit stop signal can be provided easier compared to the case of the low-noise amplifier configured with the traditional analog circuit and signal processing. Since a block that consumes the power most in the receiving circuit is normally the low-noise amplifier, if the low-noise amplifier of the present invention is incorporated in the radio receiver, the power can be saved further in the entire receiving system. In this regard, however, in addition to the ordinal stop time, additional lockup time has to be reflected to the stop signal providing device 39 as the circuit stop time. Considering the stop time newly is important.

Next, a noise reducing processing method for the amplifier implemented in the present invention will be described along with an operational flow chart shown in FIG. 7.

An input signal is loaded at step S100, and a feedback signal whose phase is reversed is added to the input signal (step S101, negative feedback step). With this, a frequency band of the signal negatively fed back is attenuated from the input signal, so that filtering is realized.

Next, amplifying this additional result (step S102, amplification step).

Then, generating a discrete signal by sampling and holding the amplified signal (step S103, discretization step) and outputting the amplified signal (step S106).

Next, performing a discrete time filtering process to the discrete signal by a calculation processing such as a moving average calculation (step S104, signal processing step).

Then, smoothing the signal to which the discrete time filtering process is performed so as to form a continuous signal (step S105, continuous step). The continuous signal is returned to step S101 as a feedback signal, with the phase being reversed, and added to the input signal.

With this, a prescribed frequency characteristic can be provided to the input signal, and the noise reduction of the amplification circuit can be realized by attenuating a noise band, without using a passive element such as an inductor.

Also, an execution content of each step of amplification step (S102), discretization step (S103), signal processing step (S104), continuous step (S105), and negative feedback step (S101), as described above, may be put into programs to be executed by a computer.

As described above, with the present invention, the low-noise amplifier whose chip area is drastically reduced can be realized, and by using this amplifier to a digital radio receiving apparatus, the chip area thereof can be reduced and the work period for design can be shortened.

The reason the chip area can be reduced is that an inductor which has been an impediment to the reduction in the chip area for the CMOS low-noise amplifier traditionally is not used, and functions su-h as enhancing the gain and providing the frequency characteristic can be performed by digital control.

And the reason the work period for design can be shortened is that analog tuning steps of forming a passive element such as a resistance, a capacitance, and an inductor, and matching to tuning frequencies of L and C, which have been required for the traditional amplifier, can be eliminated.

Further, re-configurations such as the frequency characteristic control after design is facilitated compared to the traditional art.

As an example of facilitating the re-configuration, a case in which a plurality of frequency bands are received by a single radio chip will be considered. With the traditional low-noise amplifier using only an analog processing, the low-noise amplifier which is tuned by an inductor, a capacitor, or the like is required to be prepared in accordance with the number of communication bands so as to resonate in a specified communication frequency band.

On the other hand, with the low-noise amplifier using the discretization processing of the present invention, it is possible to correspond to different frequency bands by the digital control signal from outside, and all it requires is only one low-noise amplifier main body. With this advantageous effect, it becomes possible to produce a low-noise amplifier which can correspond to a various frequency bands and gains with a single photo mask, by storing the above described control signal in a nonvolatile memory and the like before shipment.

Further, with the present invention, an amplification circuit noise reducing processing method and a program causing a computer to execute the method can also be presented.

Next, other exemplary embodiments of the invention will be described. A clock generating device which provides a sampling clock signal to the discretizing device and the discrete time filter may be arranged.

With this, a stable discretization and a corresponding discrete time filtering operation can be realized.

Also, there may be arranged a clock stopping device which stops the sampling clock signal outputted by the clock generating device.

With this, when the communication is not performed, the power can be saved by stopping operations of the discretizing device and the discrete time filter.

Also, there may be arranged further an attenuation device which attenuates a signal outputted from the discrete time filter and fed back to an input of the amplification device via the continuous device.

With this, an amplification circuit which has no possibility of generating an oscillation due to an enlarged positive feedback amount can be realized.

Further, it may be configured such that phases of an input signal inputted to the amplification device and a feedback signal fed back and inputted to the amplification device from the continuous device are in a relation of being reversed, and a negative feedback circuit is formed by the discretizing device, the discrete time filter, the attenuation device, and the continuous device.

With this, an amplification circuit which can attenuate a characteristic in a frequency band selected by the discrete time filter, so as to reduce the noise, can be realized.

Furthermore, the attenuation device may be optimized so that a gain of the negative feedback circuit becomes equal to or less than one.

With this, an amplification circuit which has no possibility of circuit oscillation and exhibits an optimum noise suppression effect can be realized.

Here, the discrete time filter may be a moving average calculation processing device.

With this, since an effective noise reduction processing can be performed by a comparatively simple calculation processing, an amplification circuit which exhibits an excellent noise suppression effect, with a small circuit area, can be realized.

Here, the discretizing device may be an A/D conversion device, the discrete time filter may be a digital signal processing device, and the continuous device may be a D/A conversion device.

With this, a more complex and effective digital filter can be realized by using a digital signal processing apparatus, and an amplification circuit which enables an effective noise reduction by changing a frequency characteristic of an amplification circuit more precisely can be realized.

While the invention has been particularly shown and described with reference to exemplary embodiments (and examples) thereof, the invention is not limited to these embodiments (and examples). It will be understood by those of ordinary skill in the art that various changes in form and details may be made therein without departing from the spirit and scope of the present invention as defined by the claims.

INDUSTRIAL APPLICABILITY

The amplification circuit according to this invention can be effectively used as a front end amplification circuit for a digital radio receiving apparatus such as a portable telephone, and there is a possibility to be used widely in such an industrial field.

DESCRIPTION OF REFERENCE NUMERALS

Figure 1:
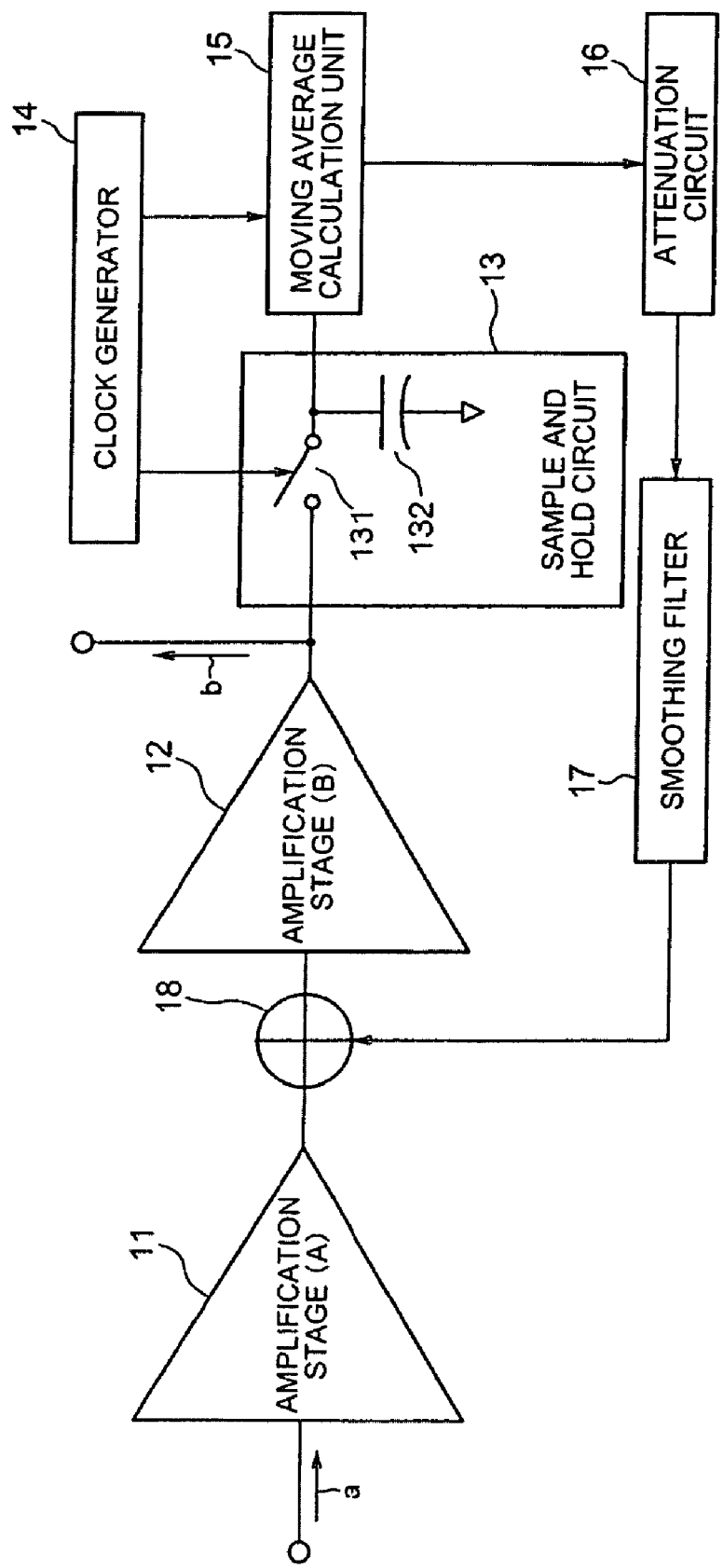
FIG. 1 is a block diagram showing a configuration of an amplification circuit according to a first exemplary embodiment of the invention.
Figure 2:
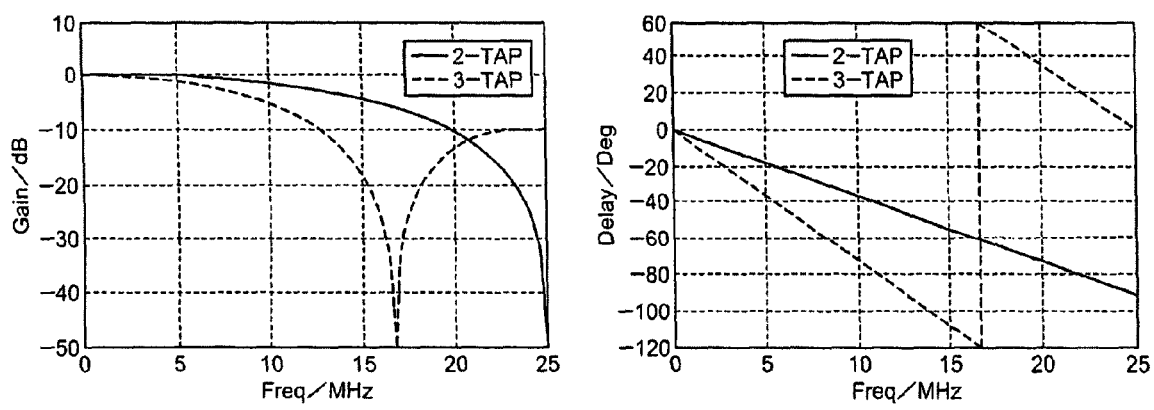
FIG. 2 is a block diagram showing a frequency characteristic of a move average calculation unit used for the first exemplary embodiment shown in FIG. 1.
Figure 3A:
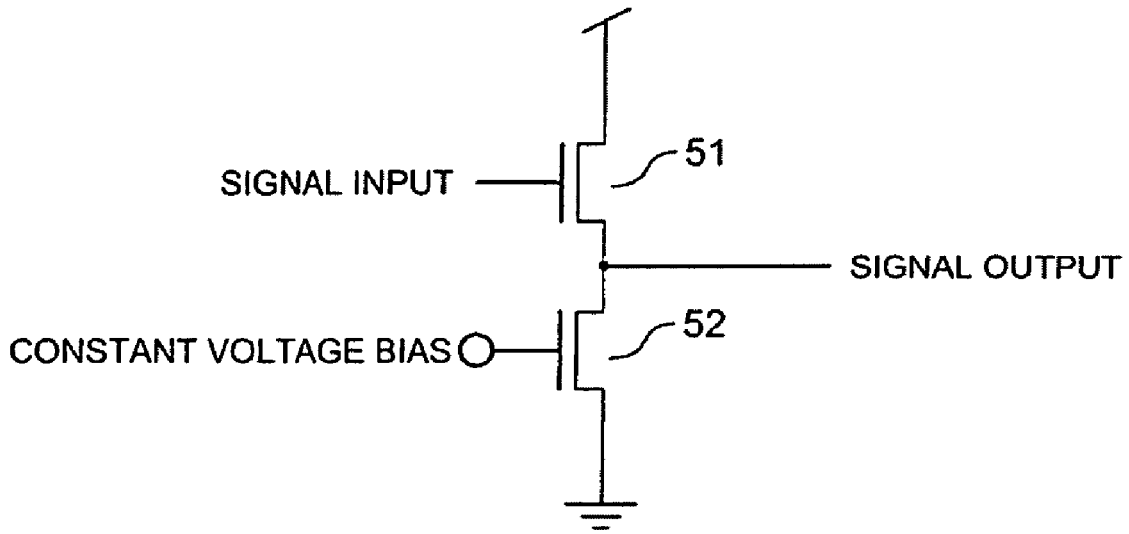
FIG. 3 is a block diagram showing a configuration of an attenuation circuit used for the first exemplary embodiment shown in FIG. 1.
Figure 3B:
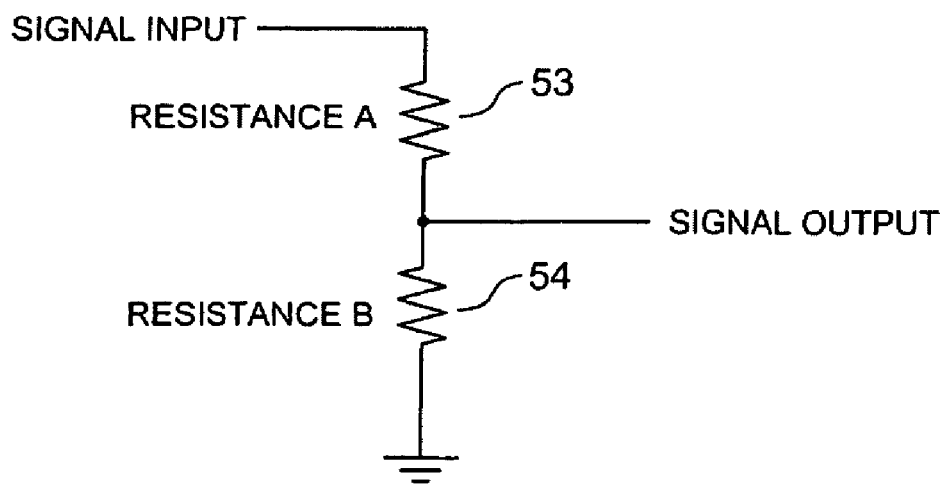
Figure 4:
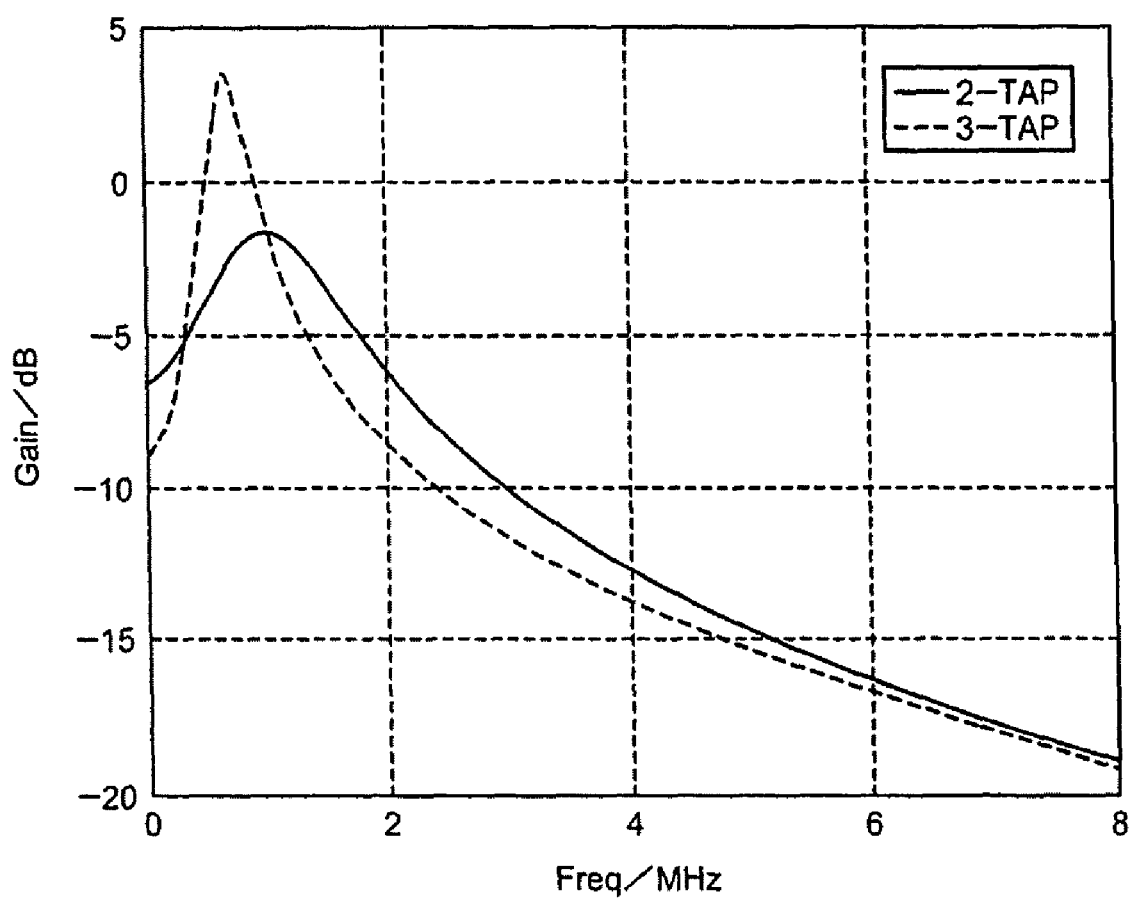
FIG. 4 is a graph showing a frequency characteristic of the amplification circuit of the first exemplary embodiment shown in FIG. 1.
Figure 5:
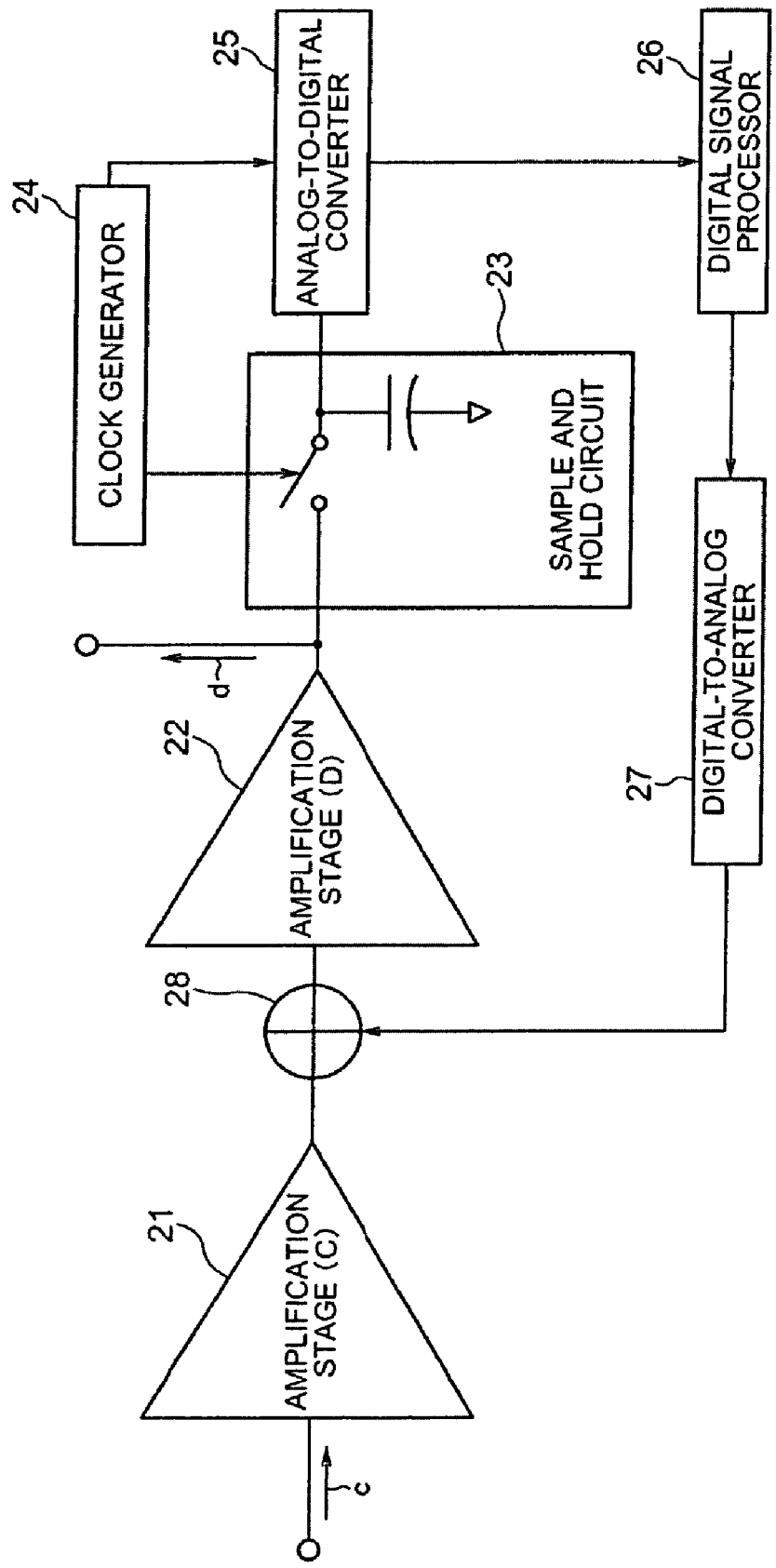
FIG. 5 is a block diagram showing a configuration of the amplification circuit according to a second exemplary embodiment of the invention.
Figure 6:
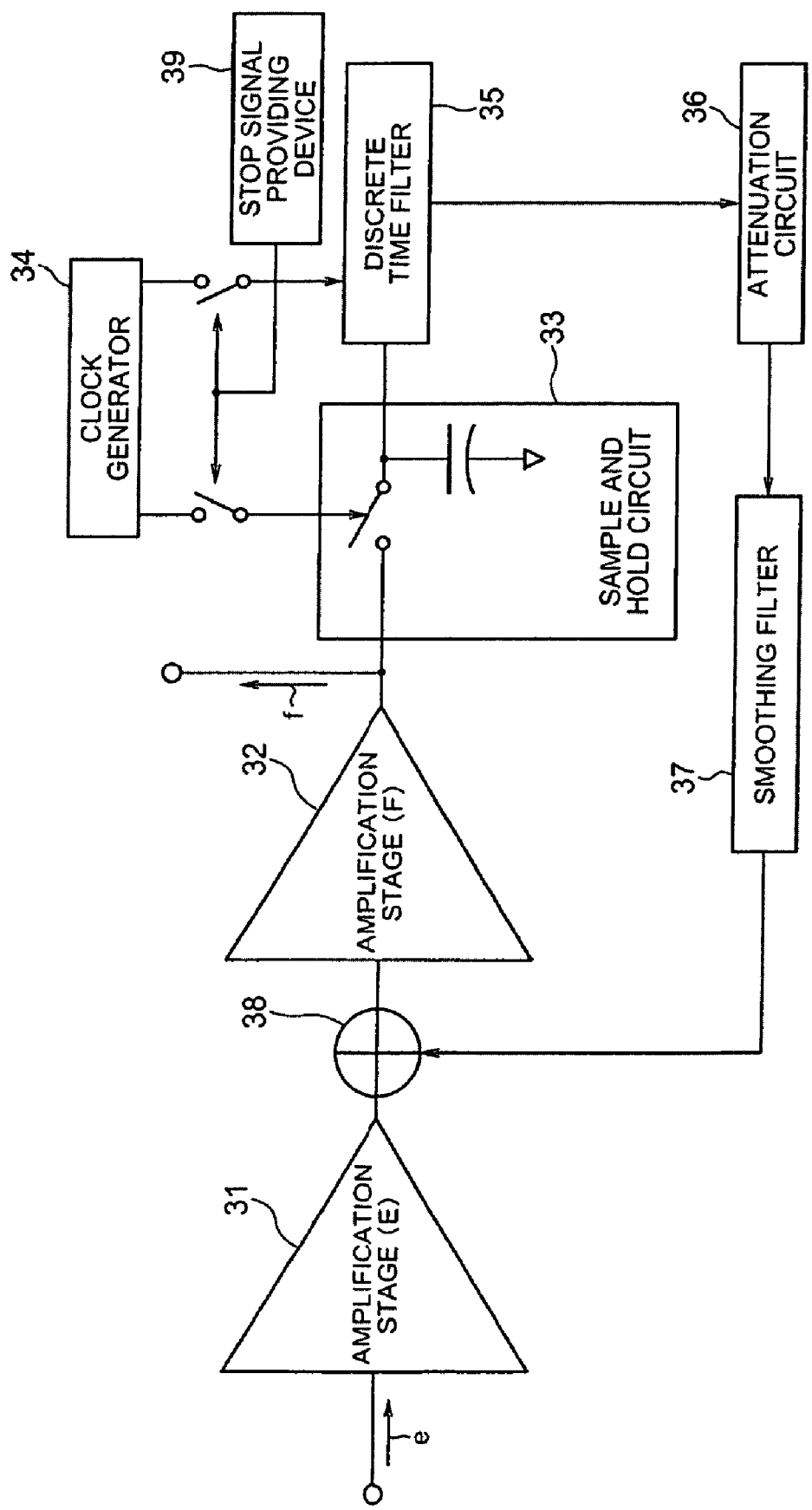
FIG. 6 is a block diagram showing a configuration of the amplification circuit according to a third exemplary embodiment of the invention.
Figure 7:
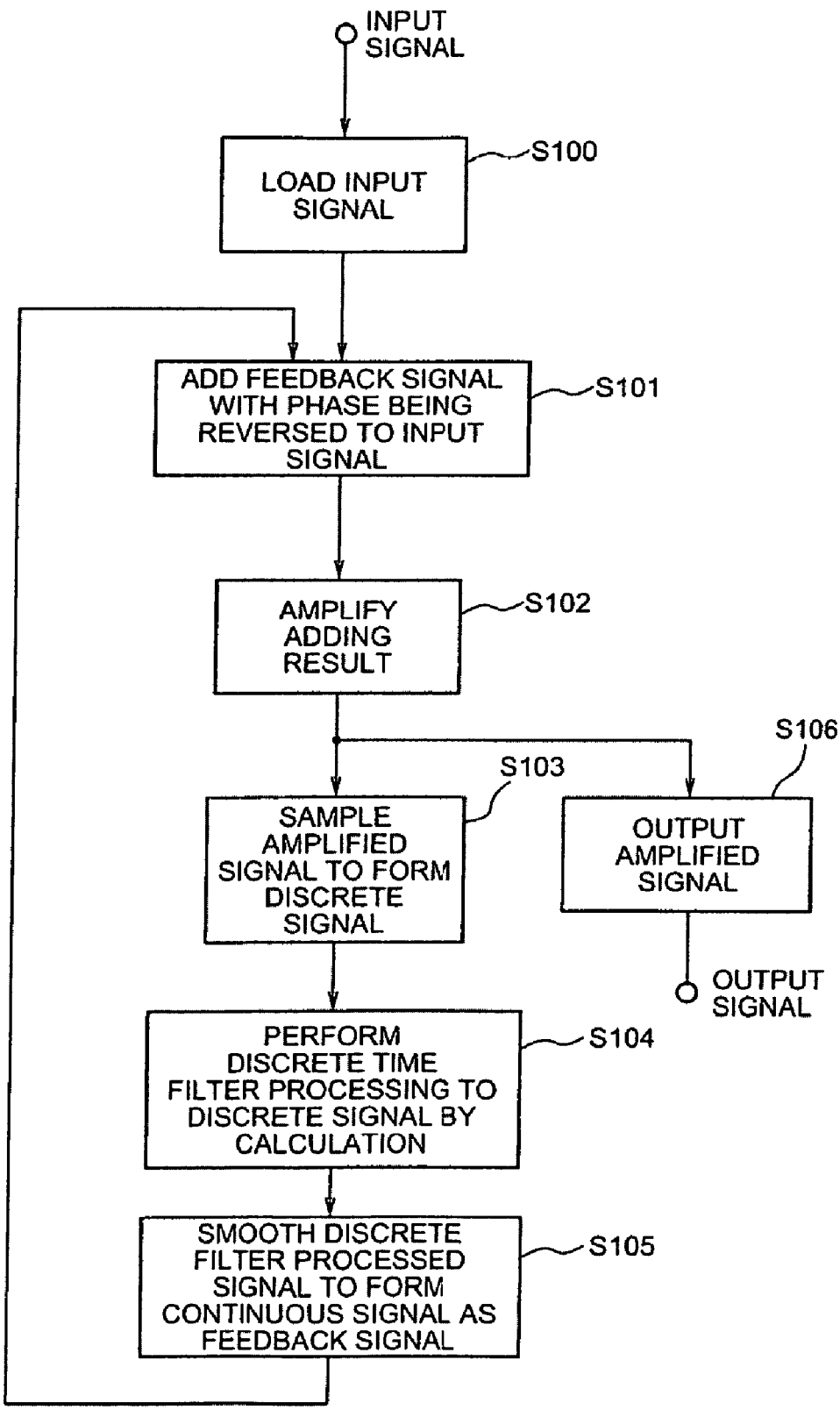
FIG. 7 is a flow chart showing an amplification device noise reducing processing method of the invention.
Figure 8:
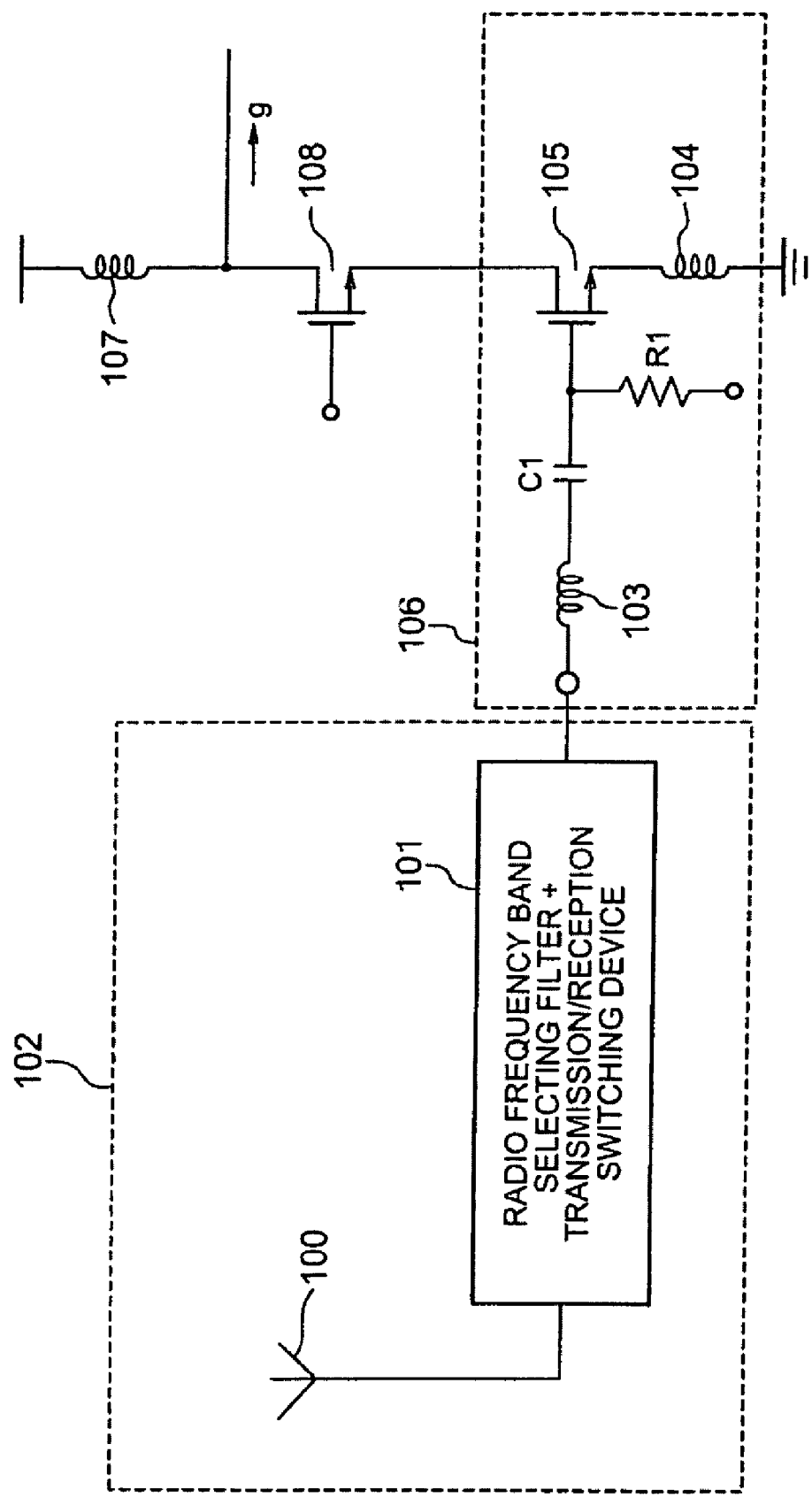
FIG. 8 is a block diagram showing the configuration of the low-noise amplifier using a related CMOS.
Figure 9:
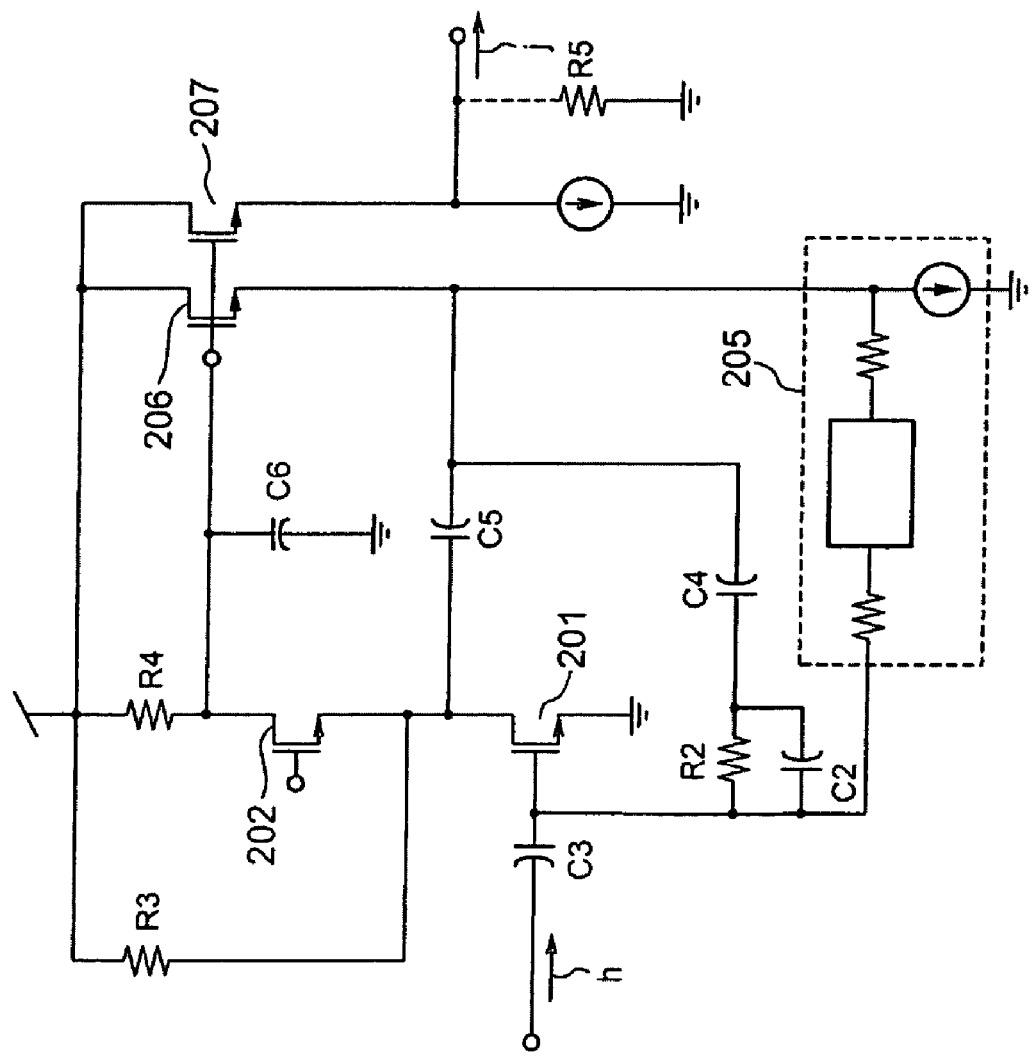
FIG. 9 is a block diagram showing a configuration of a low-noise amplification circuit using a digital CMOS without using a related inductor.

11, 12, 21, 22, 31, 32 Amplification stage (Amplification device)
13, 23, 33 Sample and hold circuit (Discretizing device)
14, 24, 34 Clock generator (Clock generating device)
15 Moving average calculation unit (Discrete time filter)
16, 36 Attenuation circuit (Attenuation device)
17, 37 Smoothing filter (Continuous device)
18, 28, 38 Adder
25 Analog-to-digital converter (A/D converting device)
26 Digital signal processor (Digital signal processing device)
27 Digital-to-analog converter (D/A converting device)

The invention claimed is:

1. An amplification circuit which amplifies and outputs an input signal, comprising:
    a discretizing device which converts the input signal to a discrete time signal by sampling the input signal with a sampling frequency which is at least twice the frequency band of the input signal;
    a discrete time filter which selects a prescribed frequency band from the discrete time signal outputted from the discretizing device and outputs the signal of the specific frequency band; and
    a continuous device which smoothes an output signal of the discrete time filter to form a continuous time signal and feeds backs the continuous signal to an input of the amplification device.

2. The amplification circuit according to claim 1, wherein a clock generating device which provides a sampling clock signal for setting a discrete timing and enabling a continuous operations is equipped to the discretizing device and the discrete time filter.

3. The amplification circuit according to claim 2, wherein a clock stopping device which stops the sampling clock signal from being outputted from the clock generating device at a time of no input signal being inputted is added to the clock generating device 4. The amplification circuit according to claim 1, wherein an attenuation device which attenuates a signal outputted from the discrete time filter and fed back to the input of the amplification device via the continuous device is further equipped.

5. The amplification circuit according to claim 4, wherein an input signal inputted to the amplification device and a feedback signal fed back and inputted to the amplification device from the continuous device are in a relation of a reversed phase, and a negative feedback circuit is formed by the discretizing device, the discrete time filter, the attenuation device, and the continuous device.

6. The amplification circuit according to claim 4, wherein the attenuation device is optimized such that a gain of the negative feedback. circuit becomes equal to or less than one.

7. The amplification circuit according to claim 1 wherein the discrete time filter is a moving average calculation processing device.

8. The amplification circuit according to claim 1, wherein the discretizing device is configured with a sample and hold circuit and an A/D conversion device, the discrete time filter and the attenuation device are configured with a digital signal processing device, and the continuous device is configured with a D/A conversion device.

9. A noise reducing processing method for an amplification device which amplifies an input signal, comprising:
- a discretization step of sampling the output of an amplification device nd converting the output to a discrete time signal;
- a signal processing step of performing a discrete time filter processing to the discrete time signal obtained in the discretization step by calculation;
- a continuous step of smoothing a signal which is discrete time filter processed in the digital signal processing step to form a continuous time signal;
- a negative feedback step of adding a continuous signal formed to be continuous in the continuous step to the input signal of the amplification device with the phase of the continuous signal being reversed; and
- an amplification step of amplifying the input signal and the continuous signal with the phase being reversed, which are added in a negative feedback step, by the amplification device.

10. A non-transitory computer readable recording medium storing a noise reducing program for an amplification device which amplifies an input signal, causing a computer to execute:
- a digital signal processing function of performing a discrete time filter processing, by a digital calculation, to the discrete time signal obtained by sampling the input signal;
- a continuous function of smoothing a signal which is discrete time filter processed by the digital signal processing function to form a continuous time signal; and
- a negative feedback function of adding a continuous signal formed to be continuous by the continuous function, with the phase being reversed, to the input signal of the amplification device.

11. Amplification means for amplifying and outputting an input signal, comprising:
- discretizing means for converting the input signal to a discrete time signal by sampling the input signal with a sampling frequency which is at least twice the frequency band of the input signal;
- discrete time filtering means for selecting a prescribed frequency band from the discrete time signal outputted from the discretizing means and outputting the signal of the specific frequency band; and
- continuous means for smoothing an output signal of the discrete time filtering means to form a continuous time signal and feeding back the continuous signal to an input of the amplification means.

* * * * *